United States Patent [19]

Shores

[11] Patent Number: 5,244,707
[45] Date of Patent: Sep. 14, 1993

[54] ENCLOSURE FOR ELECTRONIC DEVICES

[76] Inventor: A. Andrew Shores, 212 Carroll Canal, Venice, Calif. 90291

[21] Appl. No.: 818,880

[22] Filed: Jan. 10, 1992

[51] Int. Cl.⁵ .................... H01L 23/29; H01L 23/31; H01L 23/16
[52] U.S. Cl. ...................................... 428/76; 428/331; 523/466; 524/444; 257/678; 257/787
[58] Field of Search .................... 428/76, 331; 357/72, 357/74; 206/328; 524/444; 523/466

[56] References Cited

U.S. PATENT DOCUMENTS 3,849,187 11/1974 Fetscher et al. .................... 428/418
4,630,095 12/1986 Otsuka et al. .......................... 357/72

Primary Examiner—Alexander S. Thomas
Attorney, Agent, or Firm—Shapiro and Shapiro

[57] ABSTRACT

A sealed enclosure of an electronic device incorporates a coating or adhesive with desiccant properties. The coating or adhesive comprises a protonated alumino silicate powder dispersed in a polymer.

10 Claims, No Drawings

ENCLOSURE FOR ELECTRONIC DEVICES

BACKGROUND OF THE INVENTION

This invention describes a sealed enclosure surrounding an electronic device, a method for packaging an electronic device and a method of maintaining a dry atmosphere in a container type sealed electronic package by incorporating a coating or adhesive with desiccant properties.

Modern container type packagings used for electronic devices, such as integrated microcircuits (silicon chips or dies), hybrid microcircuits and surface mounted devices used as transistors, diodes, resistors, capacitors, transducers and such, are designed both to protect the sensitive components and circuits mechanically and environmentally, and to provide a functional interface to macroscopic application, such as to a printed circuit board.

There has been continuing concern regarding the presence of water vapor in hermetically sealed semiconductor devices. This concern is based upon both theoretically possible failure modes and actual observation of failure caused by corrosion due to the presence of moisture.

Hermetic microelectronic devices used in military, space and other applications requiring high reliability have an upper limit of 5,000 parts per million (ppm, by volume), of water vapor content at the time of fabrication. Package leak rate is limited to $10^{-8}$ atm-cc/sec. maximum to prevent leakage of a significant amount moist ambient air into the packaging during the device's useful lifetime. In spite of extreme precaution, it is very difficult to manufacture a hermetic packaging for microelectronic devices with low water vapor content and to maintain it during its useful lifetime. There are various channels by which water vapor finds its way to the inside of the enclosure:

1. The various seals in a packaging are usually not perfect and exhibit a small but yet sufficient leakage to allow ambient air, containing moisture, inside the enclosure.
2. Many epoxies used to bond dies and substrates outgas moisture in the packaging with time.
3. The packaging material itself outgasses a certain amount of moisture. Prebaking prior to sealing may not liberate all the absorbed moisture.
4. The sealing atmosphere may be contaminated with moisture.
5. The testing process for leakage rate may itself introduce moisture inside the package if not performed with extreme care.

The prior art has attempted to solve the moisture problem by the application of a moisture barrier coating, also referred to as passivating layer, on the microcircuit. Such products and processes include total passivation with silicone compounds and surface passivation with silicon oxide, silicon nitride and plasma deposition of polymerized hexamethyldisilazane. U.S. Pat. Nos. 4,163,072, 4,059,708 and 4,628,006, issued, respectively, to Soos, Heiss, Jr. et al. and Schnessler are illustrative of such methods. However, for a number of practical reasons these techniques were found to be less than adequate.

SUMMARY OF INVENTION

Accordingly, an object of this invention is to minimize corrosion of electronic components and micro circuits by providing and maintaining a low moisture content environment inside a hermetically sealed packaging containing these devices.

Another object is to provide an improved sealed enclosure surrounding an electronic device, wherein a coating or adhesive with desiccant properties is included in the enclosure.

A further object is to provide a method for packaging an electronic device with the use of a coating or adhesive having desiccant properties.

Still another object is to provide a method of maintaining a dry atmosphere in a container type sealed electronic package by incorporating a coating or adhesive with desiccant properties.

The above and other objects are realized in the present invention through the use of a coating or adhesive with desiccant properties. More particularly, in accordance with one of its principal aspects, the invention provides a sealed enclosure surrounding an electronic device and a coating or adhesive with desiccant properties. The coating or adhesive comprises a powder dispersed in a polymer containing the elements carbon and hydrogen and one or more of the elements oxygen, nitrogen, sulfur, halogen, silicon in its repeating unit and selected from the group consisting of plastic, elastomer and gel. The powder dispersed in the polymer is a protonated aluminosilicate of
  formula $H.AlO_2.(SiO_2)_x$, $x = 1-20$,
  void fraction 10-50 volume percent
  average pore diameter 2.5-15 Angstrom, and
  average particle size 0.2-100 micrometer.
The powder to polymer weight ratio is 0.001-2.

In accordance with another of its principal aspects, the invention provides a method for packaging an electronic device, comprising the following steps:

A. Mixing in a liquid phase a polymer with a protonated aluminosilicate powder of
  formula $H.AlO_2.(SiO_2)_x$, $x = 1-20$
  void fraction 10-50 volume percent
  average pore diameter 2.5-15 Angstrom
  average particle size 0.2-100 micrometer.
The polymer is a plastic, elastomer or gel containing the elements carbon, hydrogen and one or more of the elements oxygen, nitrogen, sulfur, halogen or silicon in its repeating unit. The powder to polymer weight ratio is 0.001-2.

B. Applying the liquid on the electronic device or on part of the interior surface of the packaging as a coating or adhesive.

C. Subjecting the coating or adhesive to heat or vacuum, and

D. Sealing the package containing the electronic device to exclude moisture from entering therein.

According to yet another of its principal aspects, the invention provides a method of maintaining a dry atmosphere in a container type electronic package by incorporating a coating or adhesive with desiccant properties in the package, the coating or adhesive comprising a powder dispersed in a polymer containing the elements carbon and hydrogen and one or more of the elements oxygen, nitrogen, sulfur, halogen, silicon in its repeating unit and selected from the group consisting of plastic, elastomer or gel, the powder being a protonated aluminosilicate with
  the formula $H.AlO_2 (SiO_2)_x$, $x = 1-20$
  void fraction 10-50 volume percent
  average pore diameter 2.5-15 Angstrom average particle size 0.2-100 micrometer, and the powder to polymer weight ratio being 0.001-2.

Other objects, advantages and novel features of the invention will become apparent from the following detailed description of the invention, which includes numerous working examples.

DETAILED DESCRIPTION OF THE INVENTION

The sealed enclosure of this invention contains an electronic device and a coating or adhesive that has desiccant properties and that comprises a protonated alumino silicate dispersed in a polymer.

Modern packagings are usually constructed from metals, ceramics or plastics. They are hermetically sealed to exclude moisture from entering, thus minimizing the possibility of corrosion during use. Hermetic seals may be formed by soldering, welding, sealing through glass and such.

The protonated alumino silicant is contained in the adhesive or coating in finely particulated form, with the average particle size being 0.2-100 micrometer, preferably 1-10 micrometer. It is also porous with a void fraction of 10-50 percent by volume. The higher the void fraction, the better the water vapor absorbing capacity. The pores are formed by microscopic holes and channels with pore diameter 2.5-15 Angstrom, preferably 3-10 Angstrom. The chemical formula of the silicate is $H.AlO_2.(SiO_2)_x$, with x ranging from 1 to 20, preferably 1-10 and more preferably 1 to 5. These protonated alumino silicates may be conveniently prepared in a number of ways, such as:

1. Acid treatment of silicon rich metaloalumino silicates, such as the minerals mordenite (sodium aluminosilicate, $x=5$) and clinoptilolite (Na,K-alumino silicate, $x=5$)
2. Thermal treatment, to liberate ammonia, of ammonium alumino silicate obtained by an ion exchange reaction from a porous metaloalumino silicate, such as fanjasite-Y (Na, K, Ca, Mg alumino silicate, $x=2.3$)

These and other preparation methods are well documented in the technical literature. Some residual metal or ammonium may remain in the compound, depending on the number and efficiency of ion exchange and thermal treatment. It is preferred to complete these reactions as much as practically possible since the metal and ammonium ions may cause or catalyze undue corrosion in the hermetic enclosure.

The alumino silicate of this invention is a finely divided powder with the average particle size ranging from 0.2 to 100 micrometer, preferably from 1 to 10 micrometer. It has surface and internal pores and channels that result in an appreciable void fraction and capability of absorbing water vapor. The void fraction is 10-50 percent by volume, usually between 15 and 40 percent. It may be measured conveniently by its capacity to absorb cyclo hexane. The average pore size is 2.5-15 Angstrom, usually between 3 and 10 Angstrom.

The water vapor absorbing capacity of the coating and adhesive of this invention is proportional to the powder/polymer weight ratio, the water vapor concentration, the reciprocal of x in the formula and the reciprocal of temperature. However, contrary to most absorbents, the silicate powder of this invention has still considerable water vapor absorbing capacity at a temperature as high as 100° C. and even some at 150° C. At 250° C. the water absorbing capacity decreases to close to zero. Thus in order to activate, e.g. desorb the adsorbed water vapor and provide maximum water vapor absorbing capacity, the adhesive or coating of this invention is heated to 250° C. or higher for a few minutes. An atmosphere containing very low moisture, such as dry nitrogen or vacuum, also results in activation even at room temperature, but in a much longer time.

The other necessary component of the coating or adhesive is an organic polymer containing the elements carbon and hydrogen and one or more of the elements oxygen, nitrogen, sulfur, halogen or silicon in its repeating unit. It may be thermoplastic or thermosetting, elastomer or gel. Examples are polysulfones, polyetherimides, polyacrylates, linear polyesters, linear polyurethanes, epoxides, polyimides, thermosetting polyurethanes, polysiloxanes, polychloroprene, polyamides, polyarylates, polyvinyl alcohol, polyalkylether or ester, polybenzimidazole, polyvinyl chloride, polyvinylidene chloride, polychlorotrifluoroethylene, polyphenylene oxide, cellulose acetatebutyrate, metal chelate polymers.

The preparation of the composition of this invention is rather simple. The powder is dispersed in the polymer, or a solvent or water dispersion of the polymer. To obtain a good dispersion, mechanical mixing and shearing is often necessary, sometimes at elevated temperatures to reduce viscosity. The powder to polymer weight ratio should be 0.001-2 to obtain a good coating or adhesive, preferably 0.01-1.

The composition may be deposited by a hand probe, brush, stencil or screen printing, doctor blading, syringe dispensing or other convenient technique at room temperature or at the melt at elevated temperature. The coating thickness is typically 0.2-15 mil following evaporation of solvent or water, if such diluent was necessary to incorporate into the formulation for ease of processing. For thermosetting polymers, a curing or crosslinking step is then followed. A moisture desorption step may also be necessary at 150°-250° C., or at vacuum, if the mixture had picked up moisture.

The adhesive or coating, usually a paste, may be deposited at part or the whole interior surface of the packaging, or the cover, wall, or top of the microcircuit, depending on other intended functions.

If the polymer is very soft, such as certain polysiloxanes, polyurethanes, polyacrylates or methyl vinyl ether, a formulation can be made with the powder of this invention to yield a gel. This can function both as a desiccant and, due to its tack, as a particle getter.

If deposited directly on the microcircuit, the coating can function both as desiccant and conformal coating.

If the powder/polymer mixture is used as an adhesive, it may bond dies, components, substrate or the whole circuit. The desiccant effect of the adhesive may be enhanced by maximizing fillet formation around the bonded part.

Sealing the enclosure or packaging hermetically is usually done in an inert, bone-dry atmosphere. The packaging is then tested for leakage rate is if the leakage rate is excessive. The presence of a desiccant in the hermetic package makes the device more reliable.

The practical examples that follow further illustrate in detail the scope of this invention.

EXAMPLE 1

100 g polysulfone pellets, having a Vicat softening temperature of 190° C., was stirred into 250 g o-dichlorobenzene heated in a 500 ml. glass beaker to 80°

C. with a hot plate to obtain a clear, viscous solution in about 4 hours. The total solids was 28.6% and the viscosity 20,000 cps (Brookfield viscometer, 3.75 per second shear rate). The following ingredients were then stirred into the solution, in order:

o-dichlorobenzene: 50.0
Dehydran ARA 7219, an antifoam manufactured by Henkel Corp.: 0.15
Protonated alumino silicate. The silicate powder of this example was prepared from a synthesized sodium aluminosilicate in the Y crystalline form and then ion exchanged to yield the protonated product with the following properties:
Color: White results compiled in Table I. The results demonstrate that:

1. The analysis technique is correct, with reasonable errors, since packages 1, 2, 19, and 20, which were included in this experiment as controls, yielded the right results.
2. The desiccant reduced the moisture content from about 15,000 ppm (no. 19,20) to below 1,000 ppm (No. 31,32,33) even after extensive temperature cycling (No. 35,36,37). The average of no. 1 and 2, 350 ppm, was subtracted from the nominal results.
3. No gases were produced as a result of the desiccant action of the composition prepared in this example, as indicated in the Table by ND=not detected.

TABLE 1

| DESICCANT IN PACKAGE | RESIDUAL GAS ANALYSIS | | | | | | | | NO | |
|---|---|---|---|---|---|---|---|---|---|---|
| | YES | | | | | | | | | |
| SEALING ATMOSPHERE | AMBIENT (1500 ppm $H_2O$) | | | | | | | | BONE DRY $N_2$/He | |
| TEMP. CYCLING | NO | | | YES | | | NO | | NO | |
| PACKAGE NO.: | 31 | 32 | 33 | 35 | 36 | 37 | 19 | 20 | 1 | 2 |
| Nitrogen, % | 77.5 | 77.6 | 77.7 | 78.6 | 78.8 | 78.6 | 78.2 | 77.1 | 82.0 | 2.3 |
| Oxygen, % | 21.5 | 21.3 | 21.5 | 20.3 | 20.2 | 20.0 | 18.8 | 20.2 | ND | ND |
| Argon, % | 0.81 | 0.81 | 0.81 | 0.91 | 0.91 | 0.91 | 0.81 | 0.91 | ND | ND |
| $CO_2$, ppm | 200 | >100 | >100 | 620 | 480 | 290 | 1628 | 1020 | <100 | <100 |
| Moisture, ppm | 1600 | 908 | 928 | 1201 | 1122 | 1120 | 16000 | 15200 | 600 | 100 |
| Helium, % | ND | ND | ND | ND | ND | ND | 0.29 | 0.20 | 17.8 | 17.5 |
| Hydrocarbons, ppm | ND | ND | ND | 315 | 189 | 180 | ND | ND | ND | ND |
| Other gases, ppm | ND | ND | ND | ND | ND | ND | ND | ND | ND | ND |

Average Particle Size: 2 micrometer
$SiO_2/AlO_2$ Molar Ratio: 2.7
Cyclohexane Absorption Capacity: 19% by weight
Average Pore Size: 7.5 Å
Residual Sodium: 1.5%
: 100

The mixture was further stirred at 2,000 rpm for half an hour. The total solids of the paste was 40 weight percent and the viscosity 20,000 cps. The powder constituted 50 weight percent and 43.6 volume percent of the desiccant mixture's total solids. The following evaluation was conducted to determine moisture absorption in a hermetic package of a hybrid microcircuit:

Nickel plated Kovar cases, numbered 1, 2, 19, 20, 31 through 37 with free internal volume of 1.6 cm$^3$ were cleaned with boiling 1,1,1-trichloroethane and isopropyl alcohol. The inside of covers no. 31 through 37 were printed with the desiccant using a 10 mil thick stencil, and dried in an oven at 150° C. for 30 minutes. The area covered by the desiccant was 1.6 cm$^2$, the thickness 4.5 mil and weight 64 mg. All the cases and lids were placed individually in 4 ounce glass jars containing about 1 gram of molecular sieve pellets at the bottom. The jars were placed into an oven at 200° C. for two hours. They were then capped and let cool to room temperature in a sealing box containing 85 parts nitrogen, 15 parts helium and less than 10 ppm moisture. Packages no. 1 and 2 were then seam sealed. The box was then opened on two opposites sides an ambient air was blown in for 15 minutes. The packages were seam sealed in this atmosphere of 70° F. and 65% relative humidity by opening the jars one at a time and complete sealing within 30 seconds. Tests showed that leakage rates of packages were not exceeding $10^{-9}$ to $10^{-8}$ atm-cc/sec. Prior to measuring their moisture content, packages no. 35, 36, 37 were screened at 150° C. for 24 hours and cycled 100 times between −65° and +150° C.

Residual gas analysis, (RGA), measuring gas composition in the cavity by mass spectrometry, provided

EXAMPLE 2

This example demonstrates the preparation of a conductive electronic grade adhesive having desiccant properties. 100 g. of a commercially available polyetherimide was dissolved in 400 g N-methylpyrrolidone. The following ingredients were then added to the stirring solution:

Antifoam: 1.0 g.
Silver Flake: 300 g.
Cabosil M-5: 10 g.
Silicate Powder of the Example 1: 15 g.

The viscous solution was stirred at 2000 rpm for 30 minutes. The adhesive was then used to bond 6 dies, 0.100 inch square each, to microcircuits printed on one square inch alumina substrates. The adhesive was deposited to fully cover 0.110 inch die pads, dried at 150° and 225° C., 10 minutes each, and the dies pressed against the dry adhesive at 280° C. for 15 seconds and cooled to obtain a strong bond.

The substrates were then bonded to Kovar cases, the packages sealed in atmospheric air, leak tested and analyzed for moisture content (RGA), all as in Example 1. The following results were obtained:

| | $H_2O$, ppm |
|---|---|
| Packages sealed in ambient air with the adhesive of this example | 871, 1592, 1621; Avg.= 1361 |
| Packages sealed in ambient air but containing no desiccant in the adhesive | 14300, 15600; Avg.= 14950 |

No gases were produced from the desiccant action of the adhesive.

EXAMPLE 3

This example shows that a composition can be prepared to result both in desiccant properties and particle getting properties.

Dow Coring #280A, a 57% total solids solution of a modified polydimethylsiloxane gel used mostly as a pressure sensitive adhesive, 175.5 g (100 g solids), was weighed out into a 500 ml glass jar and the following ingredients were added while stirring at 1500 rpm:
  Antifoam: 0.5 g
  Toluene: 50
  Silicate Powder: 30
The silicate powder of this example was prepared from the mineral mordenite and then ion exchanged to yield the protonated product with the following properties:
  Color: White
  Average Particle Size: 5 micrometer
  $SiO_2/AlO_2$ molar ratio: 5
  Cyclohexane absorption: 19% by weight
  Average Pore Size: 7 Å
  Residual Sodium: 0.5%
The solution was then dispensed on lids, dried, the packages incorporated with a microcircuit containing 22 dies bonded with an epoxy adhesive known to outgas moisture and with five pieces of ten micrometer silver flakes. The enclosures were sealed in an inert, dry atmosphere as in Example 1 and heated at 150° C. for 1000 hours. Residual gas analysis showed average moisture content of 1100 ppm, as compared to 22,500 ppm for the same packages containing no desiccant of this invention. Particle impact noise test (PIND) indicated the absence of free silver flakes—they were embedded into the adhesive.

EXAMPLE 4

This example shows that the desiccant composition of this invention may be applied directly to a microcircuit as a conformal coating.

Dow Corning Silastic #527, a silicone type encapsulant of medium durometer, 100 grams, was mixed, as in Example 1, with 20 grams of the silicate used in Example 1. The mixture was applied with a brush to the microcircuit, cured, the packages sealed, all as in Example 1. Residual gas analysis showed a decrease of water vapor from 15000 ppm, for the packages containing no coating of this example, to 950 ppm with treatment according to this example.

EXAMPLE 5-3

The following silicate/powder coatings and adhesives were evaluated for desiccant properties as in Example 1. Coating thicknesses ranged 0.2-15 mil and silicate to polymer ratios from 0.002 to 2. They were found to be functional even at 100° C.

| EXAMPLE | POLYMER |
| --- | --- |
| 5 | Polydiallylphthalate |
| 6 | Polybenzimidazole |
| 7 | Polychlorotrifluoroethylene |
| 8 | Polyurethane, heat cure |
| 9 | Epoxy, anhydride cure |
| 10 | Polyester, soft. pt. 70° C. |
| 11 | Polyacrylate, Tg = 42° C. |
| 12 | Cellulose acetate butyrate |
| 13 | Polyimide |

I claim:

1. A sealed enclosure surrounding an electronic device and a coating or adhesive with desiccant properties, said coating or adhesive comprising a powder dispersed in a polymer containing the elements carbon and hydrogen and one or more of the elements oxygen, nitrogen, sulfur, halogen, and silicon in its repeating unit, said powder being a protonated alumino silicate of:
  the formula $H.AlO_2.(SiO_2)_x$, $x = 1-20$
  void fraction 10-50 volume percent
  average pore diameter 2.5-15 Angstrom
  average particle size 0.2-100 micrometer, and
said powder to said polymer weight ratio being 0.001-2.

2. An enclosure as in claim 1, wherein said polymer is a thermoplastic selected from the group consisting of polysulfone, polyetherimide, polyester, phenoxy resin, polyacrylate, and polyurethane.

3. An enclosure as in claim 1, wherein said polymer is a thermosetting resin selected from the group consisting of polyester, polyacrylate, polyurethane, phenolic resin, and polyimide.

4. An enclosure as in claim 1, wherein said polymer is an epoxy.

5. An enclosure as in claim 1, wherein said polymer is a polysiloxane.

6. An enclosure as in claim 1, wherein said polymer is a gel.

7. An enclosure as in claim 6, wherein said polymer is a polysiloxane, polyurethane or polyacrylate.

8. An enclosure as in claim 1, wherein x is 1-10, said average pore diameter is 3-10 Angstrom, said average particle size is 1-10 micrometer and said powder to polymer weight ratio is 0.01-1.

9. An enclosure as in claim 1, wherein said polymer is an elastomer.

10. An enclosure as in claim 1, wherein said polymer is a plastic.

* * * * *